(12) United States Patent
Fujita

(10) Patent No.: US 8,936,948 B2
(45) Date of Patent: Jan. 20, 2015

(54) METHOD OF FABRICATING SEMICONDUCTOR DEVICE

(75) Inventor: Osamu Fujita, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/559,115

(22) Filed: Jul. 26, 2012

(65) Prior Publication Data

US 2013/0029436 A1 Jan. 31, 2013

(30) Foreign Application Priority Data

Jul. 28, 2011 (JP) ................. 2011-165059

(51) Int. Cl.
```
H01L 21/308    (2006.01)
H01L 21/311    (2006.01)
H01L 27/108    (2006.01)
H01L 21/66     (2006.01)
H01L 21/762    (2006.01)
```
(52) U.S. Cl.
CPC ...... *H01L 21/3081* (2013.01); *H01L 21/31116* (2013.01); *H01L 21/31138* (2013.01); *H01L 27/10876* (2013.01); *H01L 22/26* (2013.01); *H01L 21/76224* (2013.01)
USPC ................. 438/8; 257/E21.528; 257/E21.218

(58) Field of Classification Search
USPC ................................................... 438/8, 636
See application file for complete search history.

(56) References Cited

U.S. PATENT DOCUMENTS

| | | | | |
|---|---|---|---|---|
| 7,846,792 | B2 * | 12/2010 | Terahara | 438/248 |
| 2004/0084701 | A1 * | 5/2004 | Kanaya et al. | 257/295 |
| 2010/0221670 | A1 * | 9/2010 | Maekawa | 430/323 |
| 2011/0241093 | A1 * | 10/2011 | Wu | 257/302 |

FOREIGN PATENT DOCUMENTS

| | | |
|---|---|---|
| JP | 06-216024 | 8/1994 |
| JP | 2005-039180 | 2/2005 |
| JP | 2007-134668 | 5/2007 |

\* cited by examiner

*Primary Examiner* — Zandra Smith
*Assistant Examiner* — Damian A Hillman
(74) *Attorney, Agent, or Firm* — Young & Thompson

(57) ABSTRACT

A hard mask, a protective film, which protects the hard mask film from oxidation, a first mask film and a first organic film are sequentially stacked. The first organic film is processed into a first pattern, and the first mask film is etched using the patterned first organic film as a mask. After the first organic film is removed, a second organic film is formed. The second organic film is processed into a second pattern. The first mask film is secondary etched using the patterned second organic film as a mask so that the surface of the first mask film is exposed but the surface of the protective film is not exposed, thereby selectively patterning only the first mask film. After that, when removing the residual second organic film by ashing, it is possible to ensure the function of the protective film that protects the hard mask film from oxidation.

20 Claims, 13 Drawing Sheets

METHOD OF FABRICATING SEMICONDUCTOR DEVICE

BACKGROUND OF THE INVENTION

1. Field of the Invention

The present invention relates to a method of fabricating a semiconductor device, and more particularly, to a double patterning technology using a hard mask that contains a material such as an amorphous carbon film, in which the pattern precision is degraded by oxidation.

2. Description of the Related Art

In a semiconductor device such as dynamic random access memory (DRAM), an active region that is to form a cell transistor is formed in an island-shaped pattern, and two cell transistors sharing one diffusion layer are formed in one active region. A bit line is connected to the diffusion layer (a central portion of the island-shaped active region), which is shared by the two cell transistors, a capacitive device such as a capacitor is connected to two diffusion layers (both end portions of the island-shaped active region), which are not shared.

In order to form the island-shaped active region, a hard mask layer, which is made of silicon oxide, silicon nitride or the like, is formed on a semiconductor substrate, a photoresist is patterned using a photolithography technology, a hard mask layer is processed into a mask using the resultant photoresist pattern, and a trench, which is to form a device-isolation region, is formed by etching the semiconductor substrate using the processed hard mask layer as a mask.

For example, FIG. 1 shows (a) a process of exposing a photoresist 13 to light by a photolithography technology using an exposure mask (reticle) 14, which has a rectangular island-shaped pattern 15I, (b1) a process of patterning the photoresist into an island-shaped photoresist pattern 13I by developing, and (c) a process of forming an island-shaped pattern 12I by etching a hard mask layer 12 using the island-shaped photoresist pattern 13I. As shown in the foregoing example, when the photoresist layer 13 is exposed to light using the reticle 14, which has the rectangular island-shaped pattern 15I, a phenomenon in which corners of the photoresist pattern 13I after development are rounded under the influence of diffracted light (see b2). When the hard mask layer 12 is patterned using the photoresist pattern 13I rounded in the corners, the shape is transferred (see FIG. 1 (c)), and furthermore, the pattern of the active region that is formed in the semiconductor substrate 11 has the same shape.

When the corners are rounded in this fashion, there is a problem in that the contact area to which the capacitive device is to be connected decreases. In particular, it is impossible to ensure a sufficient contact area when miniaturization is progressed.

Therefore, there is used a double patterning technology, which forms an island-shaped pattern by first processing a hard mask into a line pattern using a photoresist mask, which has a line pattern extending in a first direction, and dividing the hard mask layer in a second direction using a photoresist mask, which has a line pattern extending in the second direction across the first direction.

For example, FIG. 2 shows (a) a process of exposing a first photoresist 13 to light by a photolithography technology using a first exposure mask (first reticle) having a line pattern 15L, (b) a process of patterning the photoresist into a line-shaped photoresist pattern 13L by developing, (c) a process of forming a line-shaped pattern 12L by etching a hard mask layer 12 using the line-shaped photoresist pattern 13L as a mask, (d) a process of forming a second photoresist 16 and exposing the second photoresist 16 using a second exposure mask having a line pattern 18L that has an opening in a second direction across the first direction, (e) a process of patterning the photoresist into a line-shaped photoresist pattern 16L, and (f) a process of forming an island-shaped pattern 12I by etching the hard mask layer 12L using the line-shaped photoresist pattern 16L as a mask.

In this fashion, the use of the double patterning technology makes it possible to ensure a contact area by limiting the rounding of respective components that occur when the island-shaped pattern is formed by once exposing.

In recent days in which miniaturization is underway, exposure to light is performed using a short wavelength having a shallow focus depth. Thus, it is impossible to form a thick photoresist pattern that has a large film thickness. It is difficult to process a hard mask layer (an insulating film generally made of silicon oxide or silicon nitride) that has a large film thickness using only a photoresist pattern. Therefore, a technology that uses a hard mask film, such as an amorphous carbon film, which enables the formation of a thick film pattern using a thin photoresist mask, was developed (Japanese Patent Laid-Open Publication Nos. 2007-134668, 2005-039180 and Hei 6-216024).

FIG. 3 is a view depicting a method of forming an island-shaped active region in a semiconductor substrate by the double patterning technology using an amorphous carbon film. Here, FIG. 1 to FIG. 3 are views that are drawn by the inventor in order to illustrate the object of the invention, but are not the related art itself.

A pad oxide (thermal oxide: T-OX) film 2 having a thickness, for example, of 5 nm is formed on the surface of a semiconductor substrate (silicon substrate) 1, and a silicon nitride (SiN) film 3 having a thickness, for example, of 30 nm is formed by low-pressure CVD (LP-CVD). An amorphous carbon film (a-C film) 4 is formed over the SiN film 3 to a thickness of 200 nm by, for example, plasma CVD. In addition, a silicon nitride film 5 and a silicon oxide film 6 are formed at respective thicknesses of 60 nm and 40 nm by, for example, plasma CVD as a mask layer for etching the a-C film 4 (the silicon nitride film 5 and the silicon oxide film 6 due to plasma CVD are inscribed with P-SiN 5 and P-OX 6, respectively). In addition, a bottom anti-reflective coating (BARC) 7a and a silicon-containing BARC (Si-BARC) 8a, which are organic coatings, are formed thereon as an anti-reflective film, at respective thicknesses of 200 nm and 32 nm. Finally, a photoresist film (PR) 9a for ArF is applied to a thickness, for example, 150 nm. In sequence, the PR 9a is subjected to exposure to light using an ArF excimer laser and development so that a line pattern extending in the first direction is formed, thereby producing a structure shown in FIG. 3 (a).

In sequence, the anti-reflective films (Si-BARC 8a, BARC 7a) are etched using the PR 9 as a mask, and a P-OX 6 is additionally etched. While the P-SiN 5 acts as a protective film for the a-C film 4 when etching the P-OX 6, a small amount of the P-SiN 5 is etched by over-etching that is intended to reliably pattern the P-OX 6 in the wafer face. Afterwards, the residual anti-reflective film (BARC 7a) is removed by ashing, thereby producing a structure shown in FIG. 3 (b).

In sequence, as shown in FIG. 3 (c), anti-reflective films (Si-BARC 8b, BARC 7b) and a PR 9b are formed as in the above, and then the PR 9b is exposed to light and developed so that an opening pattern extending in the second direction across the first direction is formed. Although the second direction is illustrated as being perpendicular to the first direction, this is not intended to be limiting.

The anti-reflective films (Si-BARC 8*b*, BARC 7*b*) are etched using the PR 9*b* as a mask (FIG. 3 (*d*1)). The upper side at this time is shown in FIG. 3 (*d*2). As shown in these figures, the surface of the P-SiN 5 is exposed inside the opening.

In sequence, the P-OX 6L is etched second. At this time, over-etching is performed likewise. However, the surface of the P-SiN 5 that is exposed inside the opening is also exposed to the first P-OX etching. Therefore, in some cases, the a-C film 4 that is a layer under the P-SiN 5 may be exposed due to a total of 2 times of etching. In this state, the residual anti-reflective films are removed by ashing in the same fashion as above. Then, a part of the a-C film 4 is exposed to ashing gas ($O_2$ gas), thereby forming a defect 4-*d* (see FIG. 3 (*e*1) and FIG. 3 (*e*2), which is a side view of FIG. 3 (*e*1)). In particular, this defect tends to occur in the portion in which the opening pattern of an end of cell arrays (mat) spreads out (an area in which a wide device-isolation trench is formed).

The exposed P-SiN 5 is removed, and island-shaped mask layers (P-OX 6I and P-SiN 5I) are formed (FIG. 3 (*f*)). In addition, the a-C film 4, the LP-SiN 3, the T-OX 2 and the semiconductor substrate 1 are sequentially etched, thereby forming an island-shaped active region, which is surrounded by the device-isolation trench, is formed, as shown in FIG. 3 (*g*). However, since the film thickness of the a-C film 4 is decreased in the defect 4-*d*, this becomes the reason by which the device-isolation trench (1-*d* portion) has an abnormal shape due to the subsequent etching of the lower layered films.

In addition, recently, since more reliable pattern transfer is possible, using amorphous silicon for a hard mask instead of an amorphous carbon film is being examined. However, the surface of amorphous silicon also deteriorates into silicon oxide when exposed to an oxygen atmosphere during ashing of the anti-reflective film. This makes it impossible to transfer a desired shape.

The foregoing problems are not limited to the case in which an island-shaped active region is formed, but can occur when patterning a hard mask which contains a material such as an amorphous carbon film, in which the pattern precision is degraded by oxidation, using a mask material that is processed by a double patterning technology. Therefore, it is demanded to overcome these problems.

SUMMARY

According to an embodiment of the invention, provided is a method of fabricating a semiconductor device. The method includes sequentially stacking a hard mask film comprising a material in which the pattern precision is degraded by oxidation, a protective film, a first mask film, a first anti-reflective film and a first photoresist film on a semiconductor substrate; processing the first photoresist film into a line pattern extending in a first direction; etching the first anti-reflective film using the first photoresist film of the line pattern as a mask; transferring the line pattern by etching the first mask film using the first anti-reflective film as a mask; removing the first anti-reflective film that resides on the first mask film to which the line pattern is transferred; sequentially stacking a second anti-reflective film, which is made of an organic film, and a second photoresist film on the first mask film, which is exposed after the first anti-reflective film is removed, and on the protective film; processing the second photoresist film into a pattern having an opening, which extends in a second direction across the first direction; partially removing the second anti-reflective film by etching using the patterned second photoresist film as a mask, thereby exposing a surface of the first mask film to which the line pattern is transferred and leaving the second anti-reflective film on the protective film; etching the first mask film using the second anti-reflective film as a mask, thereby forming a first mask pattern separated in the second direction; removing the second anti-reflective film residing on the first mask pattern and the protective film by ashing; etching the protective film using the first mask pattern as a mask; and forming a device-isolation trench by sequentially etching the hard mask film and the semiconductor substrate using the first mask pattern and the protective film as a mask.

According to another embodiment of the invention, provided is a method of fabricating a semiconductor device. The method includes sequentially stacking a hard mask film comprising a material in which the pattern precision is degraded by oxidation, a protective film, a first mask film and a first photoresist film on a substrate; processing the first photoresist film into a first pattern; transferring the first pattern by etching the first mask film using the first photoresist film of the first pattern as a mask; removing the first photoresist film that resides on the first mask to which the first pattern is transferred; sequentially stacking an anti-reflective film, which is made of an organic film, and a second photoresist film on the first mask film, which is exposed after the first photoresist film is removed, and on the protective film; processing the second photoresist film into a second pattern having at least an opening above the protective film at one end of the first mask film to which the first pattern is transferred; partially etching the anti-reflective film using the second photoresist film of the second pattern as a mask, thereby exposing a surface of the first mask film to which the first pattern is transferred and leaving the anti-reflective film on the protective film; etching the exposed first mask film using the anti-reflective film as a mask, thereby forming a first mask pattern to which the first pattern and the second pattern are transferred; removing the anti-reflective film residing on the first mask pattern and the protective film by ashing; etching the protective film using the first mask pattern as a mask; and sequentially etching the hard mask film and the substrate using the first mask pattern and the protective film as a mask.

According to embodiments of the invention, since the protective film of the hard mask made of a material such as an amorphous carbon film, in which the pattern precision is degraded by oxidation, is not exposed by second etching in double patterning, it is possible to prevent a defect from being formed in the hard mask film when removing the anti-reflective film made of an organic film by ashing.

BRIEF DESCRIPTION OF THE DRAWINGS

The above features and advantages of the present invention will be more apparent from the following description of certain preferred embodiments taken in conjunction with the accompanying drawings, in which:

Sub-figures (*a*), (*b*1) and (*c*) of FIG. 1 are perspective conceptual views depicting a single patterning process of the related art and sub-figure (*b*2) of FIG. 1 is a partial top plan view of (*b*1);

Figure 1:
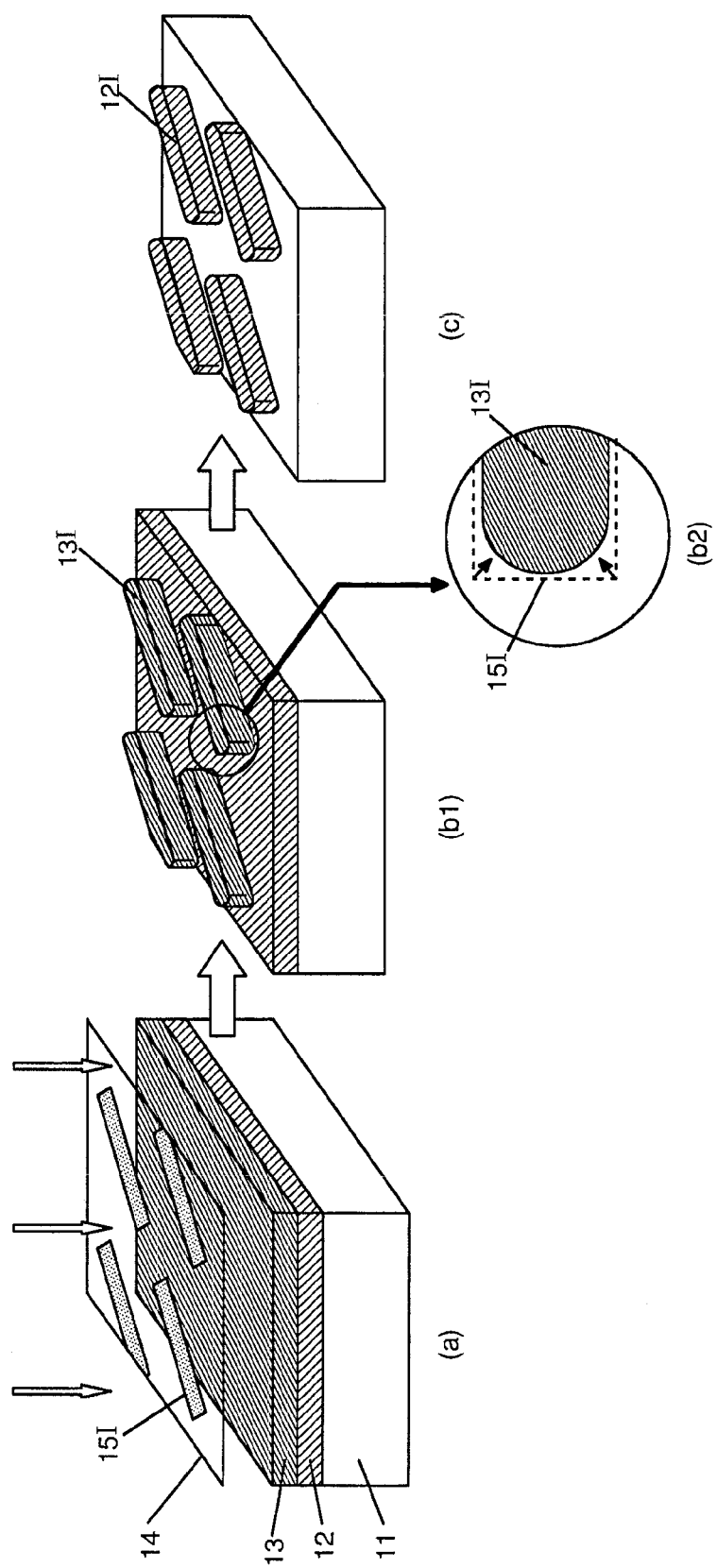
Figure 2:
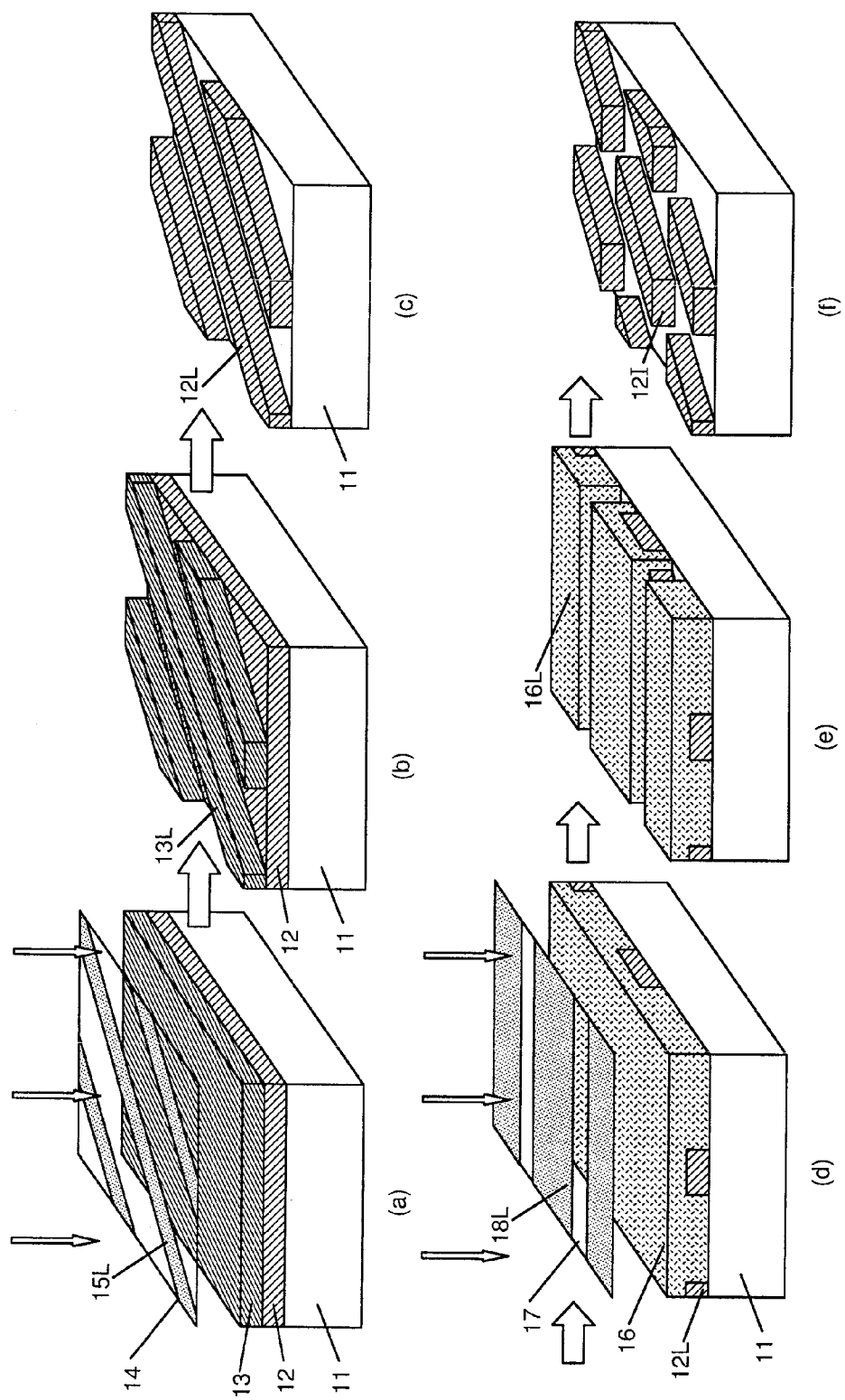
Figure 3:
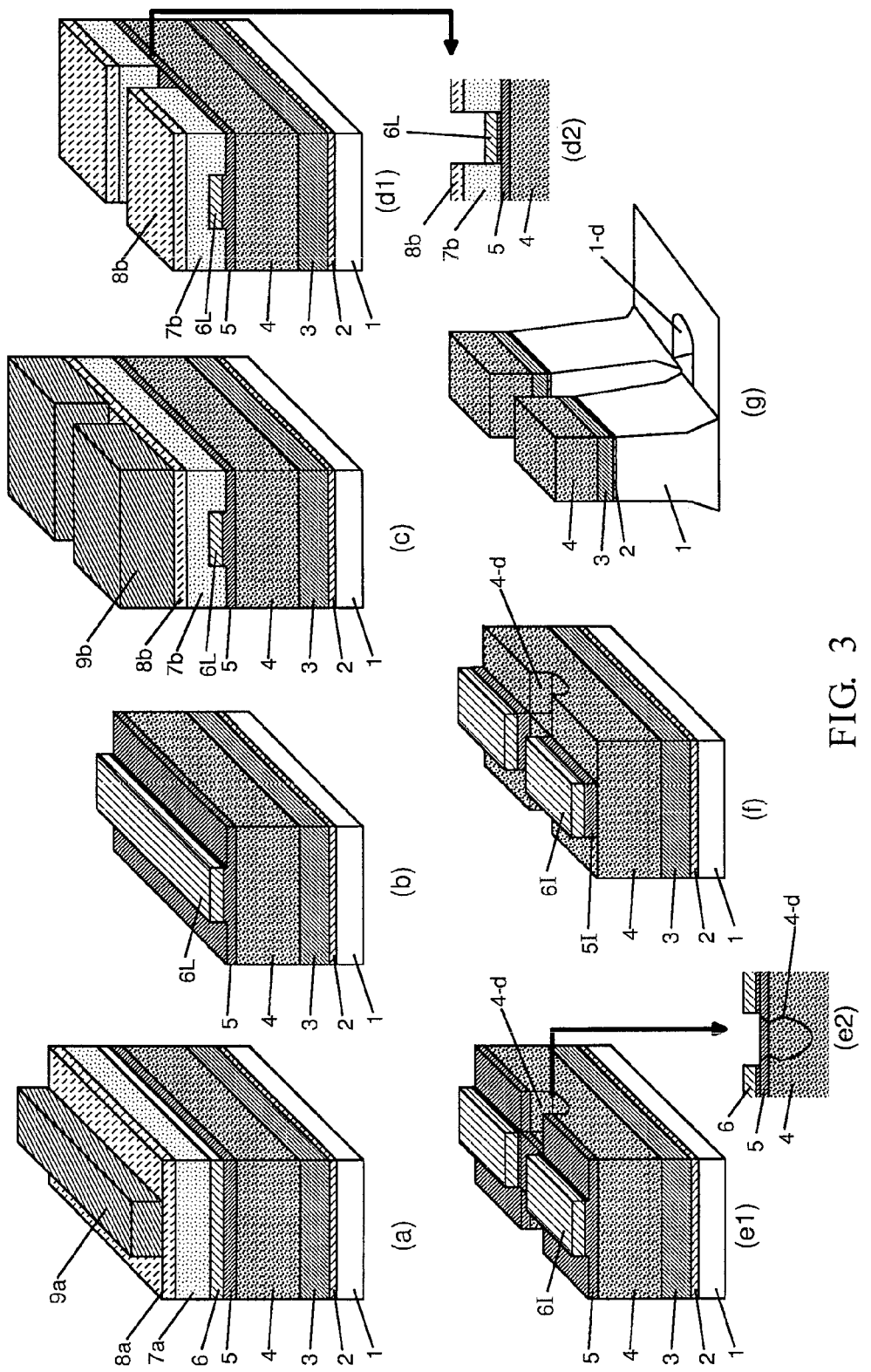
Figure 4:
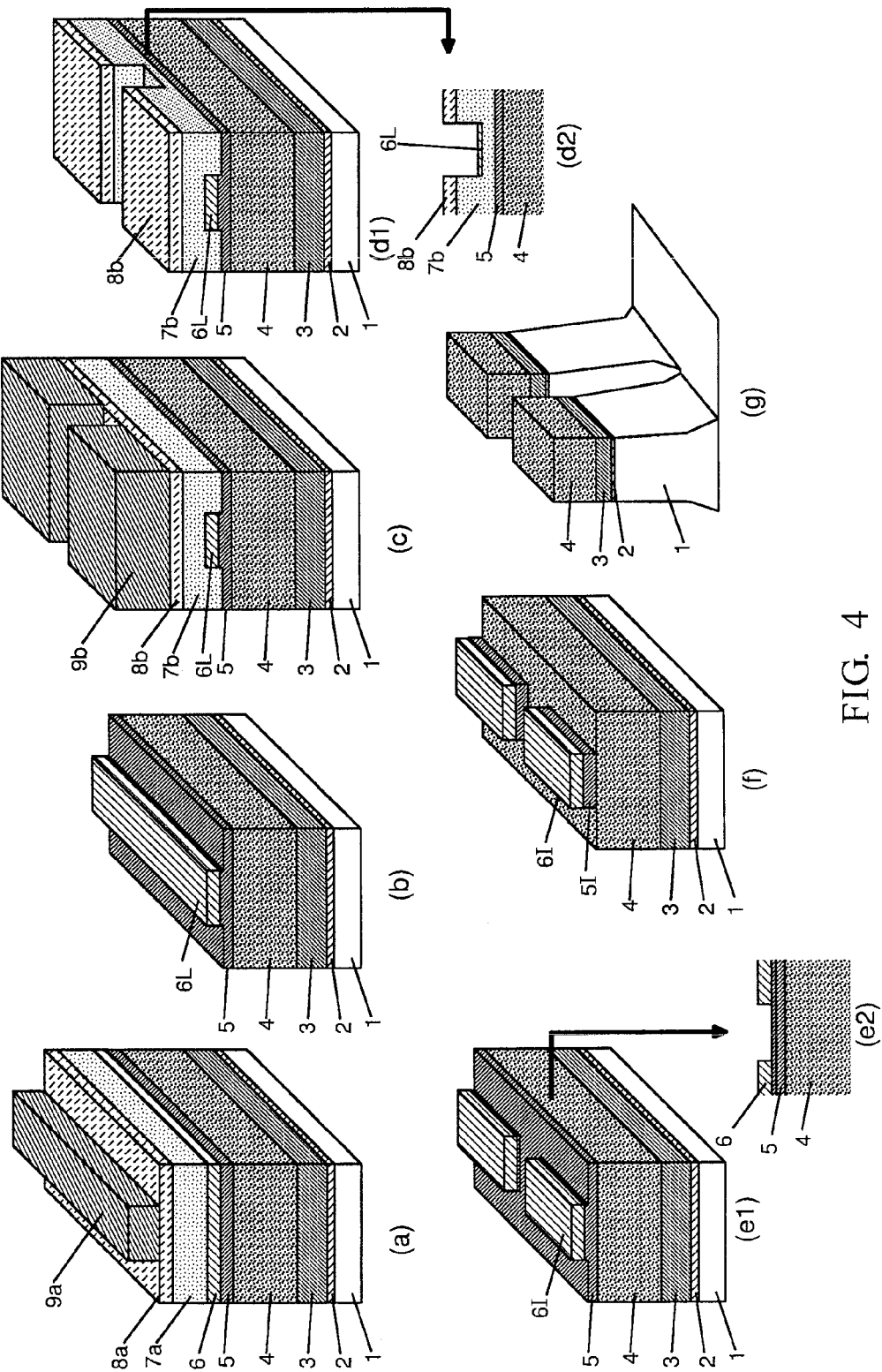
Figure 5:
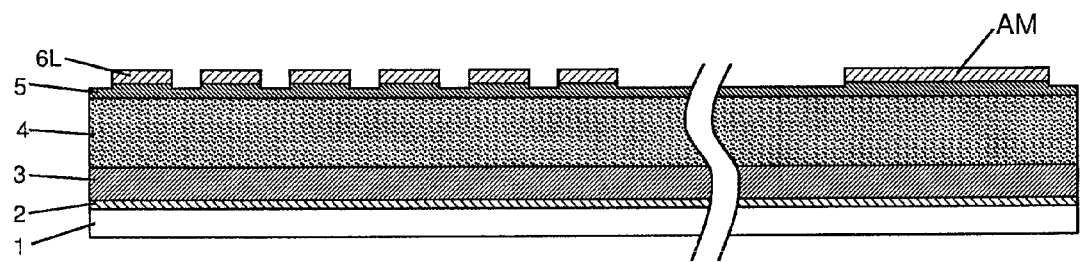
Figure 6:
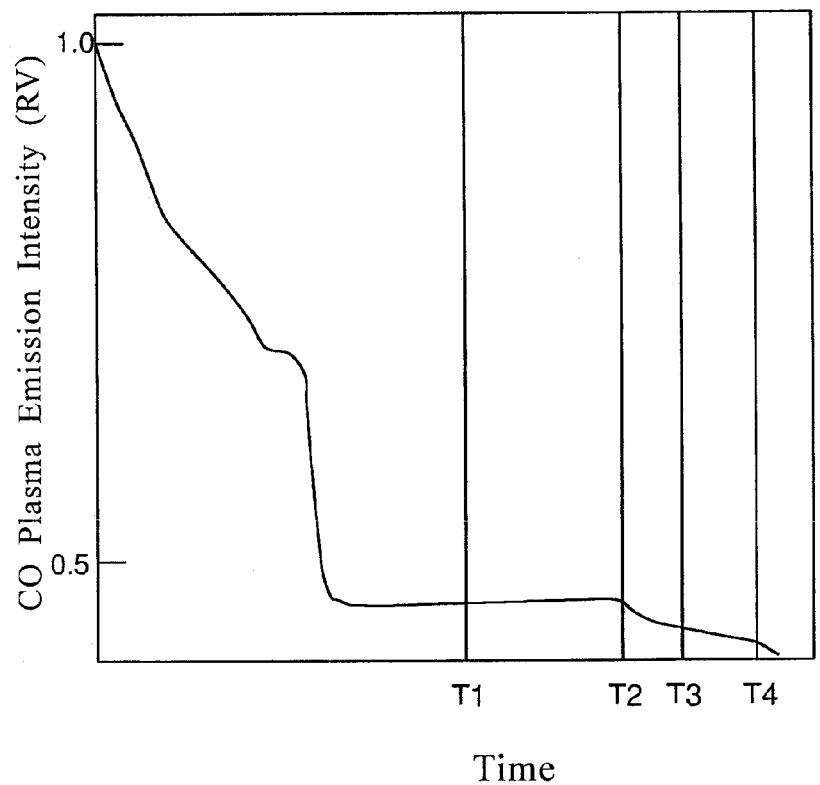
Figure 7:
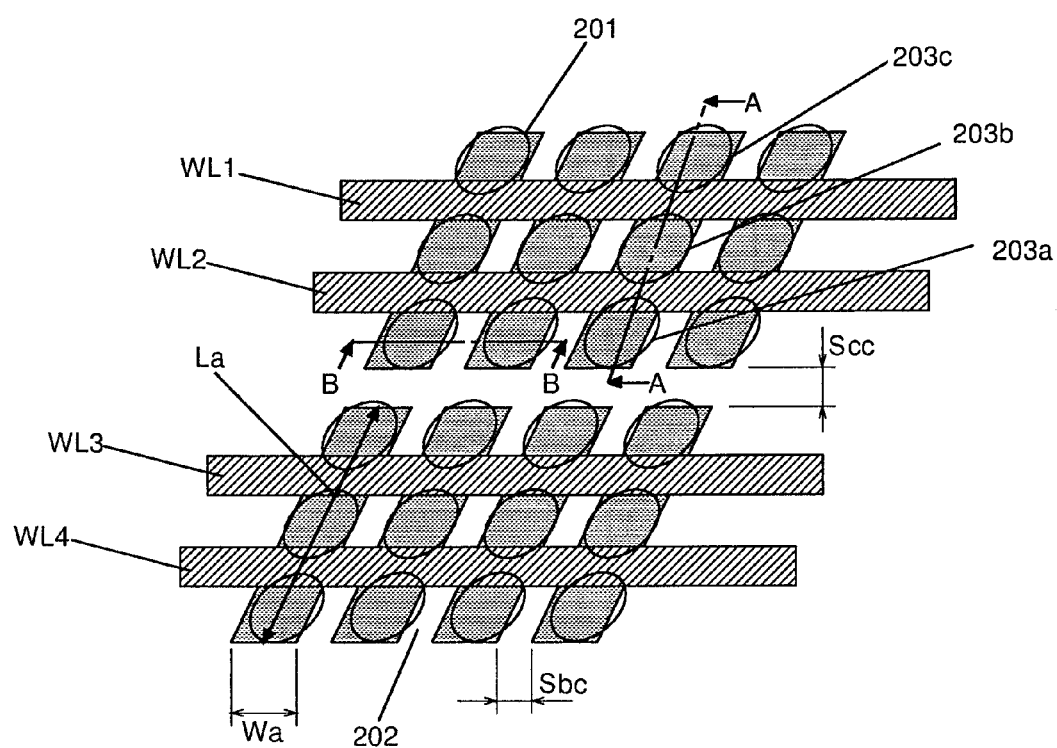
Figure 8:
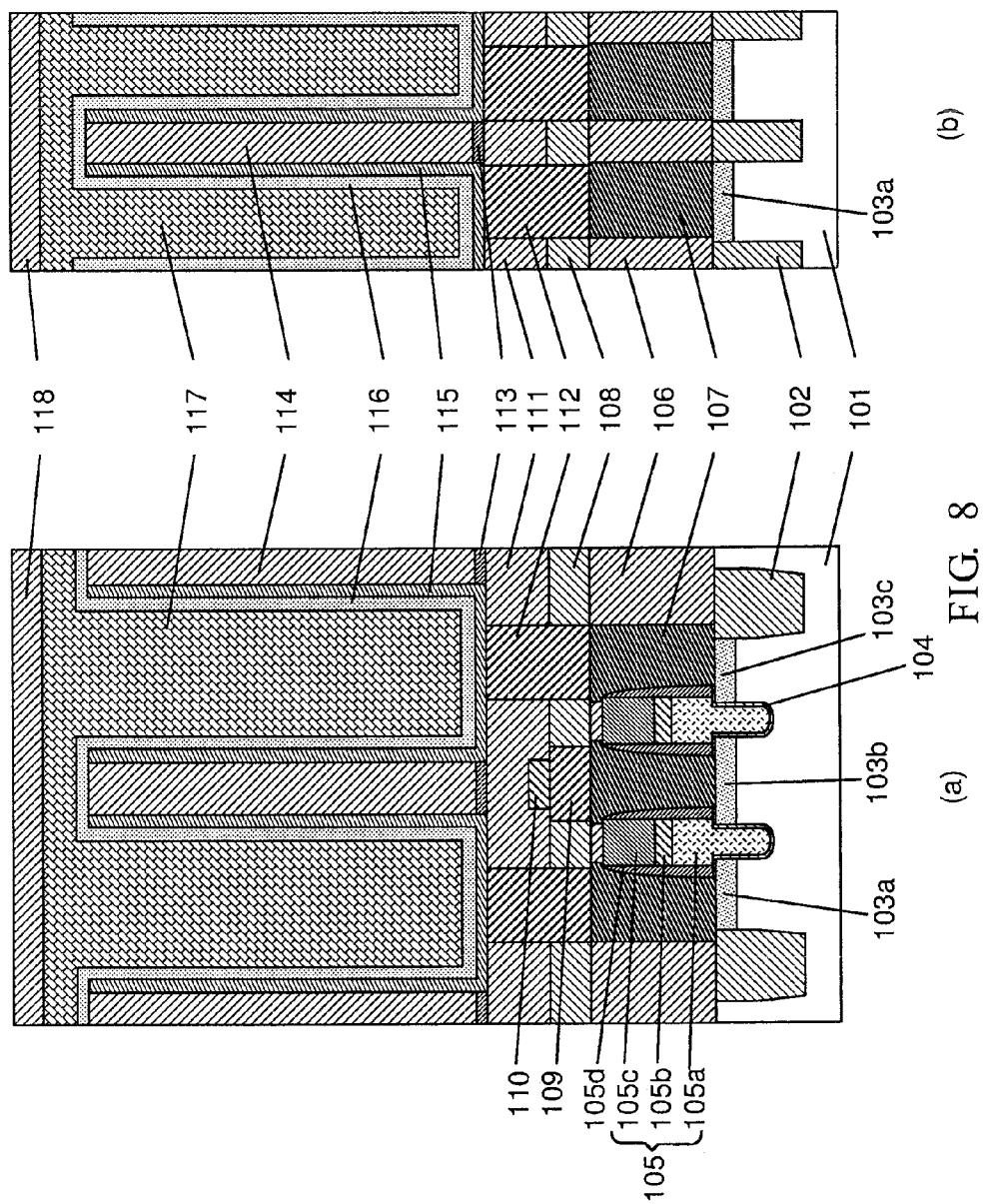
Figure 9:
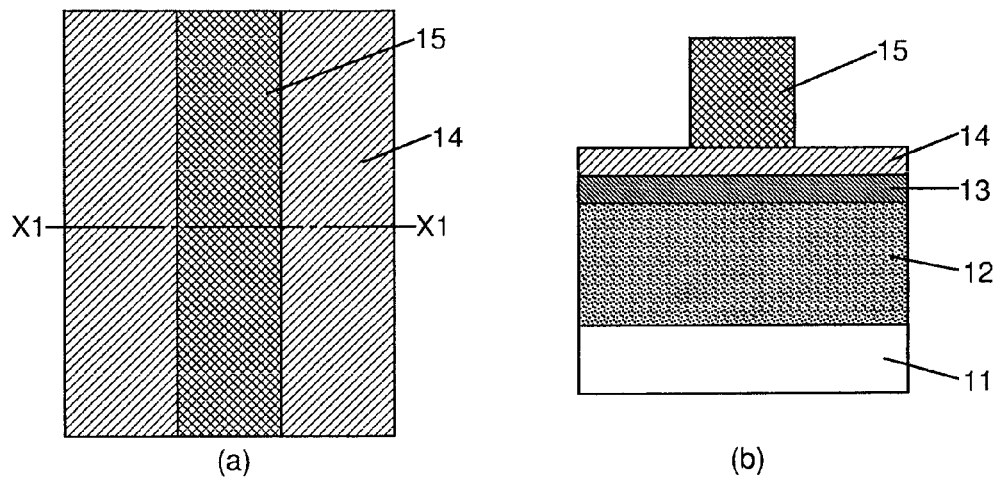
Figure 10:
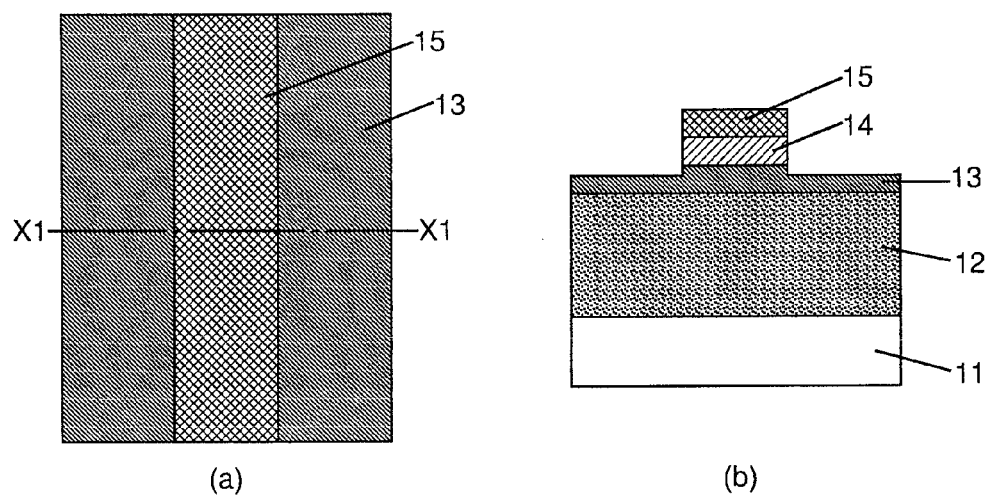

Sub-figures (*a*) to (*f*) of FIG. 2 are perspective conceptual views depicting hard mask processing steps by a double patterning technology of the related art;

Sub-figures (*a*), (*b*), (*c*), (*d*1), (*e*1), (*f*) and (*g*) of FIG. 3 are perspective conceptual views depicting hard mask processing steps by a double patterning technology of the related art, in which an amorphous carbon film is used in a portion of a hard mask, and sub-figures (*d*2) and (*e*2) are partial top plan views of (*d*1) and (*e*1), respectively;

Sub-figures (a), (b), (c), (d1), (e1), (f) and (g) of FIG. 4 are perspective conceptual views depicting hard mask processing steps by a double patterning technology according to an embodiment of the invention, and sub-figures (d2) and (e2) are partial top plan views of (d1) and (e1), respectively;

FIG. 5 is a schematic cross-sectional view depicting the state in which an alignment mark AM is formed at the same time when a P-OX 6 is patterned first time;

FIG. 6 is a graph depicting a variation in the intensity of CO plasma emission depending on etching times in order to detect a stop point in second anti-reflective etching;

FIG. 7 is a layout view of a memory cell array that is formed according to an embodiment of the invention;

FIG. 8 is a schematic cross-sectional view of a semiconductor device that is fabricated by a fabrication method of the invention, in which sub-figure (a) indicates A-A cross-section of FIG. 7 and sub-figure (b) indicates B-B cross-section of FIG. 7;

FIG. 9 and FIG. 10 are views depicting hard mask processing steps by a double patterning technology according to another embodiment of the invention, in which (a) in each figure indicates a top plan view, and (b) in each figure indicates a cross-sectional view along X1-X1 of each figure (a); and FIG. 11 to FIG. 15 are views depicting a hard mask machining process by a double patterning technology according to a further embodiment of the invention, in which each sub-figure (a) indicates a top plan view, each sub-figure (b1) indicates a cross-sectional view along X1-X1 of each sub-figure (a), each sub-figure (b2) indicates a cross-sectional view along X2-X2 of each sub-figure (a), and each sub-figure (c) indicates a cross-sectional view along Y-Y of each sub-figure (a).

DETAILED DESCRIPTION OF THE REFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Exemplary Embodiment 1

FIG. 4 is a schematic conceptual view depicting a method of transferring a pattern, which is to form an island-shaped active region on a semiconductor substrate, onto a hard mask, which includes an amorphous carbon film, by a double patterning technology and forming a device-separating recess, which divides the active region.

A pad oxide film (T-OX) 2 having a thickness, for example, of 5 nm is formed on the surface of a semiconductor substrate (silicon substrate) 1 by thermal oxidation, and a silicon nitride film (SiN) 3 having a thickness, for example, 30 nm is formed thereon by low-pressure CVD (LP-CVD). An amorphous carbon film (a-C film) 4 is formed on the SiN 3 to a thickness of 200 nm, for example, by plasma CVD. In addition, as mask layers for etching the a-C film 4, a silicon nitride film 5 and a silicon oxide film 6 are formed at respective thicknesses of 60 nm and 40 nm, for example, by plasma CVD (the silicon nitride film 5 and the silicon oxide film 6 due to plasma CVD are inscribed with P-SiN 5 and P-OX 6, respectively). In addition, an organic coating BARC 7a and a silicon-containing organic coating Si-BARC 8a are formed thereon as first anti-reflective films, to respective thicknesses of 200 nm and 32 nm. Finally, a first photoresist film (PR) 9a for ArF is coated to a thickness, for example, of 150 nm. In sequence, the PR 9a is subjected to exposure to light using an ArF excimer laser and development so that a line pattern extending in the first direction is formed, thereby producing a structure shown in FIG. 4(a).

Although this example shows only one line pattern, in practice, a plurality of lines are arranged in parallel because the active region for a DRAM memory cell includes a plurality of active regions that are arranged in an array.

Here, the film thickness of the P-OX 6 can range from 30 nm to 100 nm. More preferably, the film thickness ranges from 40 nm to 50 nm. As shown in FIG. 5, when one-time etching the P-OX 6, which will be described later, an alignment mark AM, which is used in second lithography of double patterning, is formed using the P-OX 6. However, when the film thickness is smaller than 30 nm, detection of the alignment mark AM may be difficult. In some cases, the P-OX 6 may not act as a mask when transferring the pattern onto the P-SiN 5. When the thickness is greater than 100 nm, the precision of the pattern transfer is degraded since the photoresist suitable for short-wavelength exposure cannot be made thick, as described in the description of the related art. In this embodiment, the film thickness of P-OX 6 is 40 nm, such a problem will never occur.

In addition, a double-layer structure including the BARC and the Si-BARC is used as the anti-reflective films. If it is possible to etch the P-OX 6 using only the BARC, it is not necessary to prepare the Si-BARC. In the meantime, the Si-BARC may use an organic coating, which is obtained by adding about 40 wt % of Si particulates to a material that is equivalent to the BARC.

In sequence, the anti-reflective films (Si-BARC 8a, BARC 7a) are etched using the PR 9a as a mask, and then P-OX 6 is etched. Although the P-SiN 5 acts as a protective film of the a-C film 4 when etching the P-OX 6, a small amount of the P-SiN 5 is also etched by over-etching that is intended to reliably pattern the P-OX 6 in the wafer face. Afterwards, the residual anti-reflective film (BARC 7a) is removed by ashing, thereby producing a structure shown in FIG. 4 (b).

Here, the anti-reflective films (Si-BARC 8a, BARC 7a) are etched under the following conditions.
Etching gas: $Cl_2/HBr/O_2$=30/20/50 Sccm
Pressure: 1.3 Pa (10 mtorr)
Source/bias power: 500 W/100 W Under the above-described conditions, the selection ratio of the P-OX 6/the anti-reflective films (Si-BARC 8a, BARC 7a) becomes 1.7, and thus sufficient selective etching is possible.

In addition, the P-OX 6 is etched under the following conditions.
Etching gas: $CHF_3$=125 Sccm
Pressure: 0.8 Pa (6 mtorr)
Source/bias power: 500 W/200 W In sequence, as shown in FIG. 4 (c), after second anti-reflective films (Si-BARC 8b, BARC 7b) and a second photoresist film (PR 9b) are formed in the same fashion as above, the PR 9b is subjected to exposure to light and development so that an opening pattern extending in the second direction across the first direction is formed. Although the second direction is illustrated as being perpendicular to the first direction, this is not intended to be limiting.

The anti-reflective films (Si-BARC 8b, BARC 7b) are etched using the PR 9b as a mask (FIG. 4 (d1)). The upper side at this time is shown in FIG. 4 (d2). As shown in these sub-figures, an etching stop point is determined such that the surface of the P-OX 6L is exposed but the surface of the P-SiN 5 is not exposed.

The etching stop point can be easily detected by measuring the intensity of CO plasma emission, which is present in the etching atmosphere. FIG. 6 is a graph depicting a variation in the intensity of CO plasma emission depending on etching times. CO plasma is known as generating light in the vicinity of 483 nm, and the intensity of light emission can be measured by spectroscopic analysis performed on this wavelength light using a luminescent monitor. In the period up to T1, high intensity of light emission due to the etching of the PR 9b is observed, but, afterwards, a steady-state follows as the etching proceeds to a certain time. Typically, the period up to a time point T1 is known to some extent, monitoring is performed before this point. At a time point T2, an inflection point of light emission intensity is observed. Here, the surface of the P-OX 6L is correctly exposed. In addition, over-etching is performed in order to obtain uniformity in the wafer face. Although another inflection point is observed at a time point T4, this is attributable to the exposure of the surface of the lower P-SiN 5. Therefore, in the invention, the etching is stopped at T3 intermediate between T2 and T4. The time point T3 corresponds to over-etching by about 10% after the surface of the P-OX 6L is exposed.

In sequence, as shown in FIG. 4 (*e*1), the exposed P-OX 6L is etched, thereby forming an island-shaped P-OX 6I. The surface of the P-SiN 5 is not exposed to the etching since it is covered with the BARC 7b. At this time, over-etching is also performed as in first etching. Afterwards, the residual anti-reflective films (Si-BARC 8b, BARC 7b) are removed.

In the invention, since the P-SiN 5 sufficiently functions as the protective film of the a-C4 film, the defect 4-*d* shown in FIG. 3 (*e*1) is not formed.

In sequence, as shown in FIG. 4 (*f*), the P-SiN 5 is processed into an island-shaped P-SiN 5I by etching it using the P-OX 6I as a mask.

In addition, the a-C film 4, the LP-SiN 3, the T-OX 2 and the semiconductor substrate 1 are sequentially etched, thereby forming an island-shaped active region surrounded by a device-isolation trench, as shown in FIG. 4 (*g*).

After the substrate is etched, the residual a-C film is removed by ashing, and then a device-isolation insulating film is formed. Although the LP-SiN 3 and the T-OX 2 may be removed, it is advantageous to leave them as etching stoppers when planarizing the device-isolation insulating film by CMP instead of removing them.

FIG. 7 is a layout view of a memory cell array that uses an island-shaped active region, which is formed in this fashion. 201 indicates an active region that is formed by a method of the invention (the surface is a diffusion layer doped with impurities), and 202 indicates a device-isolation region which divides active regions such that devices are isolated. Sbc indicates the space between bit contacts, Scc indicates the space between capacitive contacts, Wa indicates the width of an active region, La indicates the length of an active region, and WL1 to WL4 indicate word lines. Although not shown, the precision of dimensions in word line processing may be ensured by forming dummy word lines over the device-isolation regions 202 between the capacitive contacts. In addition, 203*a* and 203*c* indicate capacitive contact forming portions, and 203*b* indicates bit contact forming portions. In an example, in the invention, 40 nm-node DRAM is formed with the following dimensions: The width Wa of an active region is 40 nm, the length La is about 140 nm, the space Sbc between bit contacts is 25 nm, and the space Scc between capacitance contacts is about 20 nm.

FIG. 8 is a schematic cross-sectional view of a semiconductor device according to an embodiment of the invention, in which sub-figure (*a*) indicates a cross-section corresponding to A-A of FIG. 7 and sub-figure (*b*) indicates a cross-section corresponding to B-B of FIG. 7.

A device-isolation region 102 is formed in a semiconductor substrate 101 by burying the device-isolation trench, which is formed by applying the method of the invention, with an insulating film, thereby partitioning an island-shaped active region 103. Diffusion layers 103*a*, 103*b* and 103*c* doped with impurities are formed in the surface of the active region 103. The diffusion layers 103*a*, 103*b* and 103*c* correspond to contact-forming portions 203*a*, 203*b* and 203*c*, which are shown in FIG. 7, respectively. A gate electrode 105 is formed as a part of a word line on the semiconductor substrate. The gate electrode 105 has a conductive layer 105*a* made of polysilicon or the like, which is insulated from a diffusion layer by a gate insulating film 104, a metal layer 105*b* made of tungsten (W) or the like, a cap layer 105*c* made of an insulating material, and a gate sidewall 105*d* in both sides thereof. Although this embodiment shows the gate electrode having a recess gate structure, this is not intended to be limiting. In addition, a poly-metal structure in which a metal layer is formed on polysilicon is illustrated, a polycide structure in which tungsten silicide (WSi) is formed on polysilicon may also be used. A cell contact plug 107 is formed so as to extend through a first interlayer insulating film 106 on the semiconductor substrate, and a bit line contact 109 is formed so as to extend through a second interlayer insulating film 108. A bit line 110 is connected to the bit line contact 109. In addition, a capacitive contact 112 is formed so as to extend through a third interlayer insulating film 111, which covers the capacitive contact 112, and a second interlayer insulating film 108. On top of the capacitive contact 112, a fifth interlayer insulating film 114 and a fourth interlayer insulating film 113 are stacked. The fifth interlayer insulating film 114 acts as a template for forming a capacitor. The fourth interlayer insulating film 113 acts as an etching stopper when forming a cylinder hole. Inside the cylinder hole, a lower electrode 115, a dielectric film 116, and an upper electrode 117 are formed, thereby constructing a capacitor. An upper interlayer insulating film 118 is formed on top of the upper electrode 117, and a contact plug, lines (not shown) or the like, which are connected to the upper electrode, are formed, thereby completing a semiconductor device.

Modified Example

In the foregoing exemplary embodiment, the P-OX 6 is first divided between the bit contacts in the first direction by a first photolithography process, and is then divided between the capacitive contacts in the second direction by a second photolithography process. However, it is also preferable that the P-OX 6 be divided between the capacitive contacts in the first direction by a line pattern that is formed by a first photolithography process and the P-OX 6 be divided between bit contacts in the second direction by a second photolithography process.

Exemplary Embodiment 2

Although the foregoing exemplary embodiment 1 illustrates an example in which the method of the invention is applied to the formation of an island-shaped active region that is used in the memory cell array, the invention is not limited thereto. The invention can be applied to any methods that pattern a mask film on an amorphous carbon film using a double patterning technology. Below, other examples of application are presented.

In this exemplary embodiment, a description will be given of a case in which a low resolution pattern is formed using only a photoresist film in first mask film patterning, and a high resolution pattern is formed by second mask film patterning. FIG. 9 to FIG. 15 are views depicting a fabrication method of this embodiment, in which each sub-figure (*a*) indicates a top plan view, and each sub-figure (*b*) indicates a cross-sectional view along X1-X1 of each sub-figure (*a*), and each sub-figure (*c*) indicates a cross-sectional view along Y-Y of each sub-figure (*a*).

First, an a-C film 12, a p-SiN as a protective film 13, a P-OX as a first mask film 14 are sequentially stacked on a substrate 11, a first photoresist film 15 is formed thereon, and as shown in FIG. 9, a first pattern (a line pattern in this example) is formed by exposure to light and development.

In sequence, as shown in FIG. 10, a first mask film 14 is etched using the first photoresist film 15 as a mask, thereby transferring the first pattern. Here, a small amount of the P-SiN acting as the protective film 13 is also etched by over-etching.

Figure 11:
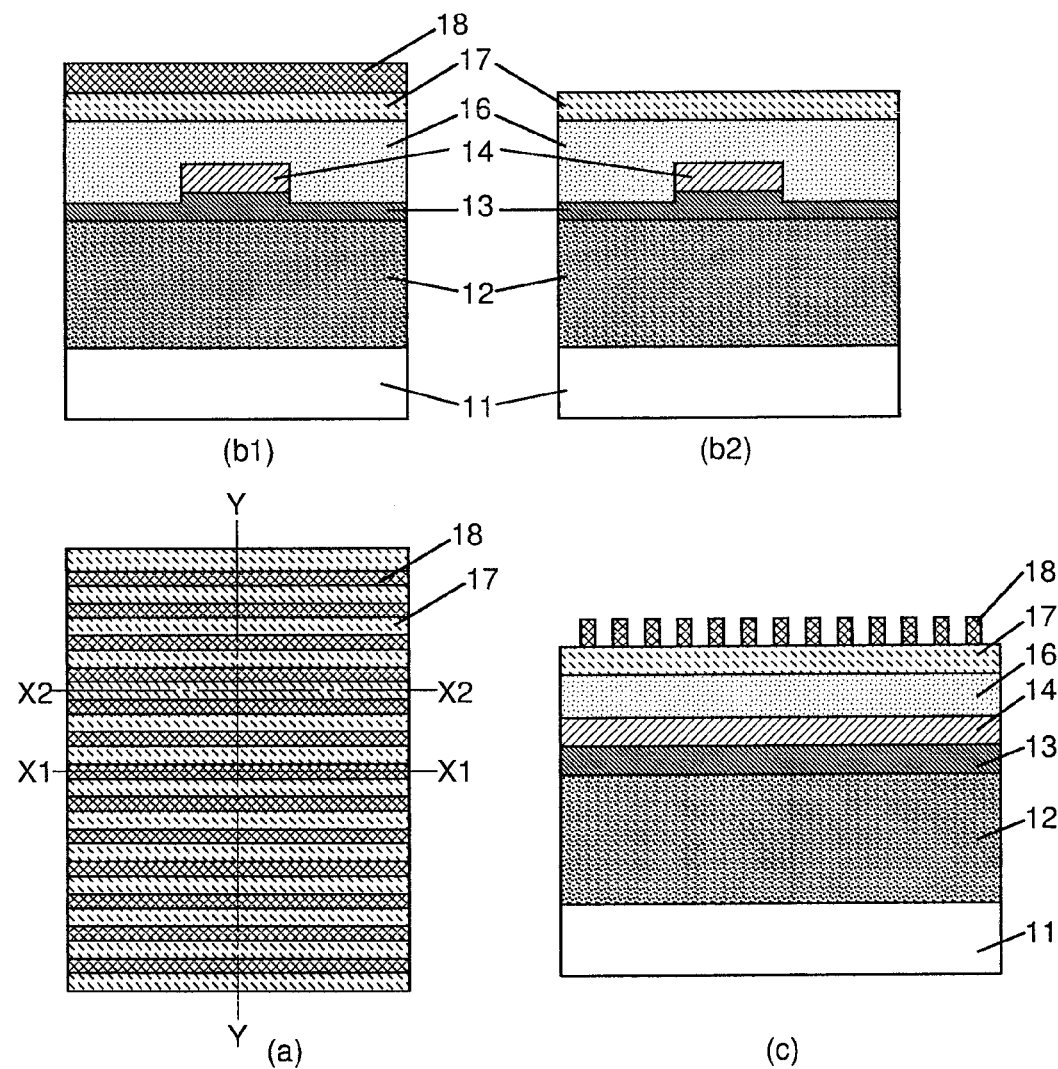

After the residual photoresist film 15 is removed, anti-reflective films (BARC 16, Si-BARC 17) are deposited, thereby forming a high-resolution second photoresist film 18, and then, as shown in FIG. 11, a second pattern (a line pattern perpendicularly intersecting the first pattern in this example) is formed by exposure to light and development.

Figure 12:
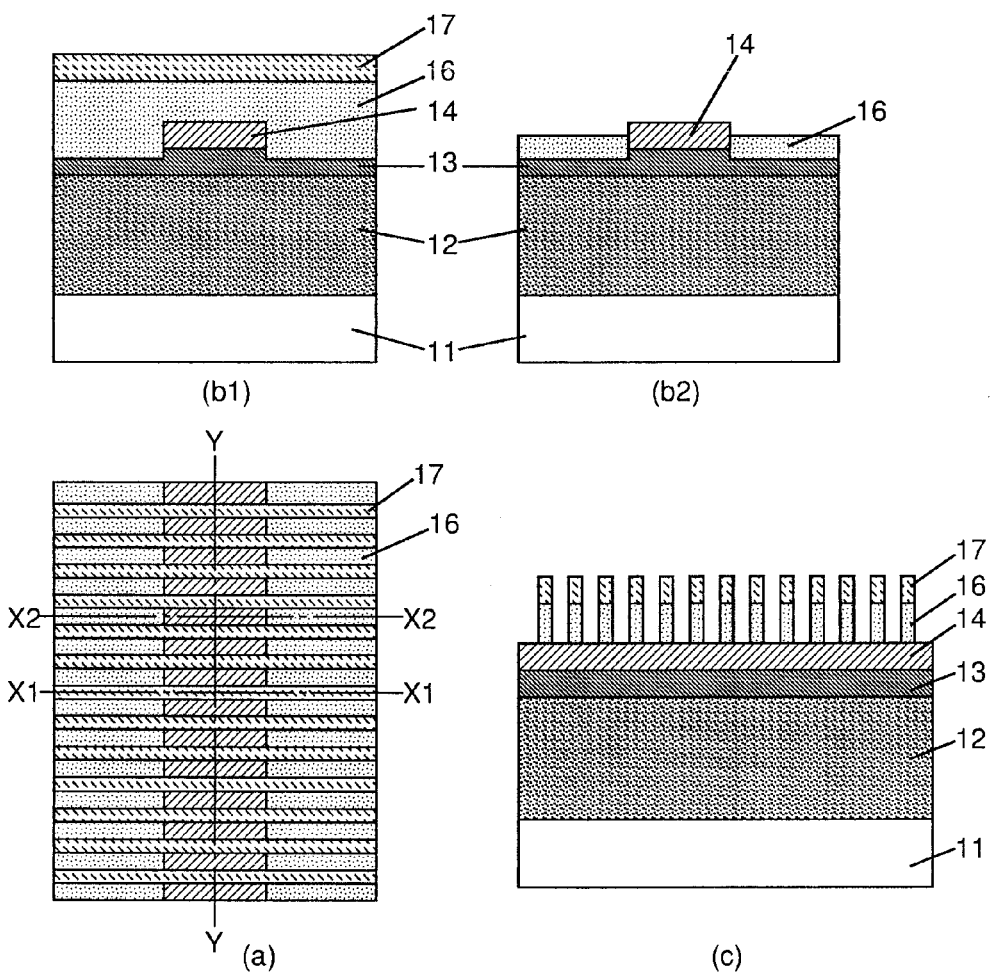

In sequence, as shown in FIG. 12, in the same fashion as in the exemplary embodiment 1, the anti-reflective films are etched using the first photoresist film 18 as a mask so that the first mask film 14 is exposed but the surface of the protective film 13 is not exposed, thereby transferring the second pattern to the anti-reflective films (BARC 16, Si-BARC 17).

Figure 13:
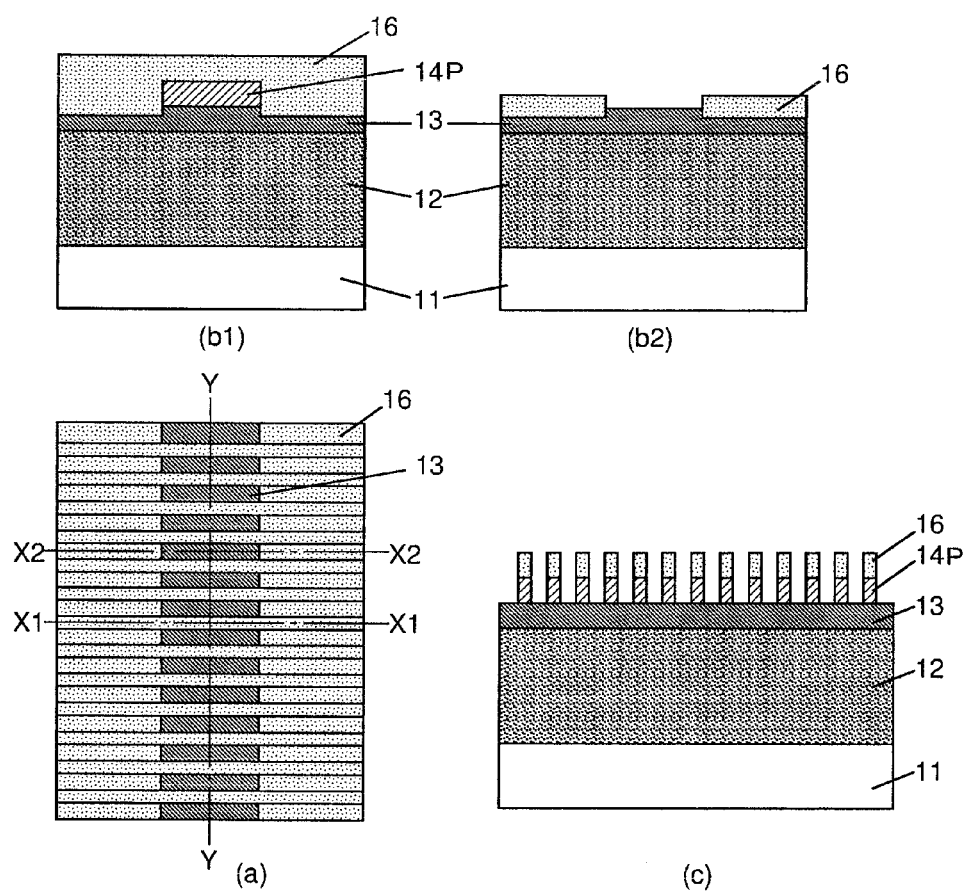

In sequence, as shown in FIG. 13, the exposed first mask film 14 is etched using the anti-reflective films as a mask, thereby forming a first mask pattern 14P, which are partitioned by the first pattern and the second pattern.

Figure 14:
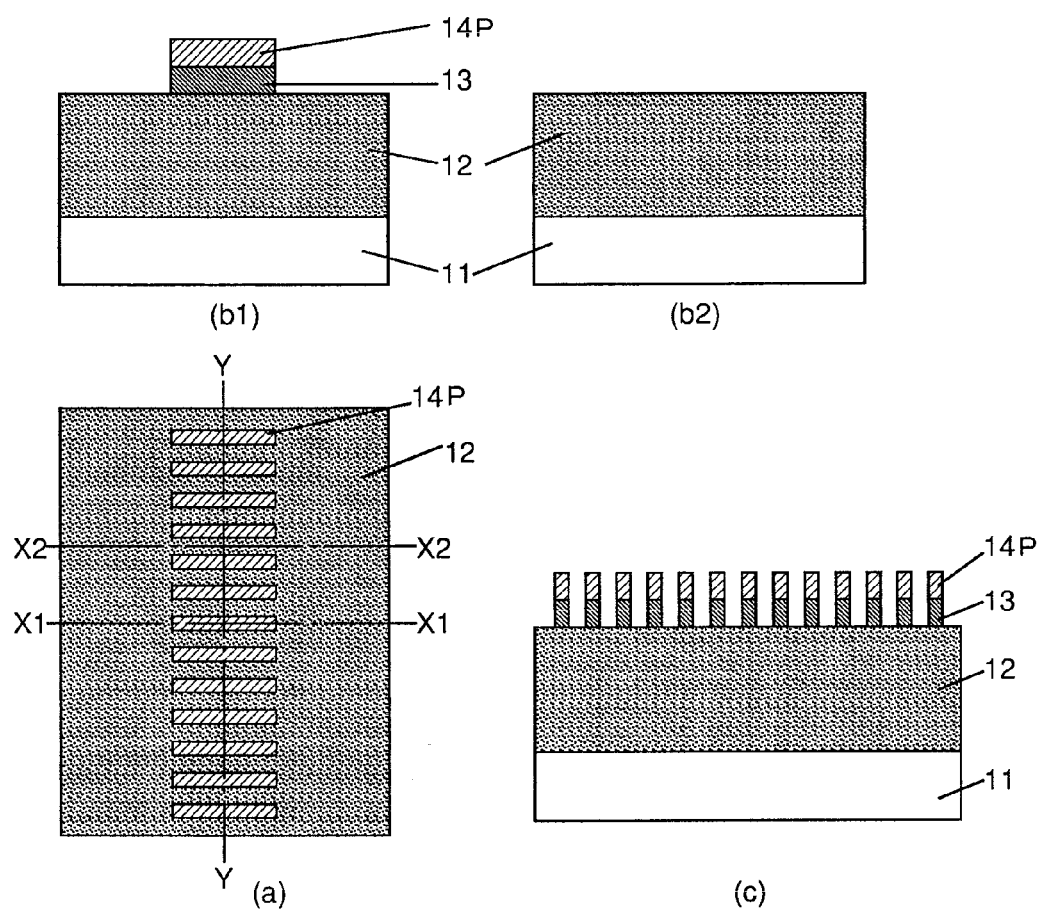
Figure 15:
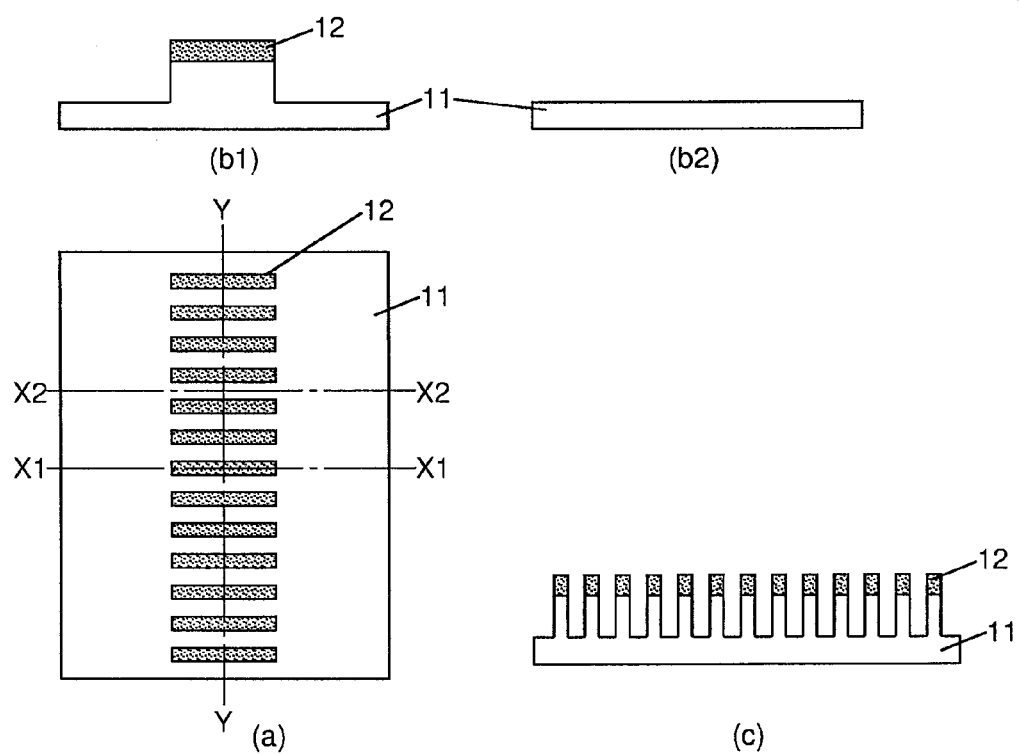

In sequence, the residual anti-reflective films are removed by ashing, and then, as shown in FIG. 14, the protective film 13 is etched using the first mask pattern 14P as a mask. In sequence, as shown in FIG. 15, the a-C film 12 and the substrate 11 are etched.

Also in this exemplary embodiment 2, since the protective film 13 is not etched when the first mask film 14 is second etched, a defect attributable to the loss of the protective film 13 is not formed in the a-C film 12. When etching the substrate later, the shape of the first mask pattern 14P can be transferred without any problems.

Here, the substrate 11 may be a semiconductor substrate or a structure in which a conductive film, an insulating film or the like is formed on a semiconductor substrate. In addition, although the line pattern was used as the first pattern and the second pattern, but this is not intended to be limiting. Rather, a combination of any patterns may be used. Here, the second pattern is formed as a pattern that has at least an opening above the protective film at one end of the first mask film to which the first pattern is transferred.

Although the foregoing exemplary embodiments 1 and 2 were illustrated with respect to the case in which an amorphous carbon film is included as a hard mask film, it is apparent that the case in which an amorphous silicon film is used instead of the amorphous carbon film can also be applied. When the amorphous silicon film is used, the protective film is not exposed to second etching. Thus, when performing ashing treatment on the anti-reflective film, it is possible to reliably prevent the amorphous silicon film from deteriorating using the protective film, thereby enabling reliable pattern transfer. This is equally applicable when a hard mask film that is made of a material, in which the pattern precision is deteriorated by oxidation, other than the amorphous carbon film or the amorphous silicon film is used.

What is claimed is:

1. A method of fabricating a semiconductor device, comprising:
   sequentially stacking a hard mask film comprising a material in which the pattern precision is degraded by oxidation, a protective film, a first mask film, a first anti-reflective film and a first photoresist film on a semiconductor substrate;
   processing the first photoresist film into a line pattern extending in a first direction;
   etching the first anti-reflective film using the first photoresist film of the line pattern as a mask;
   transferring the line pattern by etching the first mask film using the first anti-reflective film as a mask;
   removing the first anti-reflective film that resides on the first mask film to which the line pattern is transferred;
   sequentially stacking a second anti-reflective film, which is made of an organic film, and a second photoresist film on the first mask film, which is exposed after the first anti-reflective film is removed, and on the protective film;
   processing the second photoresist film into a pattern having an opening, which extends in a second direction across the first direction;
   partially removing the second anti-reflective film by etching using the patterned second photoresist film as a mask, thereby exposing a surface of the first mask film to which the line pattern is transferred and leaving the second anti-reflective film on the protective film;
   etching the first mask film using the second anti-reflective film as a mask, thereby forming a first mask pattern separated in the second direction;
   removing the second anti-reflective film residing on the first mask pattern and the protective film by ashing;
   etching the protective film using the first mask pattern as a mask;
   etching the hard mask film to transfer the first mask pattern using the first mask pattern of the first mask film and the protective film as a mask; and
   etching the substrate to form a device-isolation trench using the hard mask film to which the first mask pattern is transferred and removing the first mask film and the protective film residing on the hard mask film simultaneously.

2. The method according to claim 1, wherein partially etching the second anti-reflective film is performed using a dry etching apparatus, wherein a stop point is detected by providing the apparatus with a means for measuring intensity of CO plasma emission.

3. The method according to claim 2, wherein partially etching the second anti-reflective film stops at a time point when the first mask film is over-etched by 10% after detecting that the surface of the first mask film is exposed.

4. The method according to claim 1, wherein the protective film is a silicon nitride film and the first mask film is a silicon oxide film.

5. The method according to claim 4, wherein the silicon oxide film, which acts as the first mask film, is formed with a thickness from 30 nm to 100 nm.

6. The method according to claim 5, wherein an alignment mark for processing the second photoresist film is formed simultaneously when etching the first mask film using the first anti-reflective film as a mask.

7. The method according to claim 1, wherein the first and second anti-reflective films are stacked films of an organic coating and a silicon-containing organic coating.

8. The method according to claim 1, wherein an insulating film is provided between the hard mask film and the semiconductor substrate and the insulating film is also etched in forming the device-isolation trench, and wherein after forming the device-isolation trench, the process further comprises removing the hard mask film, forming a device-isolation insulating film and planarizing the device-isolation insulating film by chemical-mechanical polishing using the insulating film as an etching stopper.

9. The method according to claim 1, wherein the hard mask film comprises at least an amorphous carbon film or an amorphous silicon film as a film that is in contact with the protective film.

10. A method of fabricating a semiconductor device, comprising:
sequentially stacking a hard mask film comprising a material in which the pattern precision is degraded by oxidation, a protective film, a first mask film and a first photoresist film on a substrate;
processing the first photoresist film into a first pattern;
transferring the first pattern by etching the first mask film using the first photoresist film of the first pattern as a mask;
removing the first photoresist film that resides on the first mask to which the first pattern is transferred;
sequentially stacking an anti-reflective film, which is made of an organic film, and a second photoresist film on the first mask film, which is exposed after the first photoresist film is removed, and on the protective film;
processing the second photoresist film into a second pattern having at least an opening above the protective film at one end of the first mask film to which the first pattern is transferred;
partially etching the anti-reflective film using the second photoresist film of the second pattern as a mask, thereby exposing a surface of the first mask film to which the first pattern is transferred and leaving the anti-reflective film on the protective film;
etching the exposed first mask film using the anti-reflective film as a mask, thereby forming a first mask pattern to which the first pattern and the second pattern are transferred;
removing the anti-reflective film residing on the first mask pattern and the protective film by asking;
etching the protective film using the first mask pattern as a mask;
etching the hard mask film to transfer the first mask pattern to the hard mask film using the first mask pattern and the protective film as a mask; and
etching the substrate using the hard mask film as a mask to which the first mask pattern is transferred and removing the first mask film and the protective film residing on the hard mask film.

11. The method according to claim 10, wherein partially etching the anti-reflective film is performed using a dry etching apparatus, wherein a stop point is detected by providing the apparatus with a means for measuring intensity of CO plasma emission.

12. The method according to claim 11, wherein partially etching the anti-reflective film stops at a time point when the first mask film is over-etched by 10% after detecting that the surface of the first mask film is exposed.

13. The method according to claim 10, wherein the protective film is a silicon nitride film and the first mask film is a silicon oxide film.

14. The method according to claim 13, wherein the silicon oxide film, which acts as the first mask film, is formed with a thickness from 30 nm to 100 nm.

15. The method according to claim 14, wherein an alignment mark for processing the second photoresist film is formed simultaneously when the first mask film is processed using the first photoresist film as a mask.

16. The method according to claim 10, wherein the anti-reflective film is stacked films of an organic coating and a silicon-containing organic coating.

17. The method according to claim 10, wherein the hard mask film comprises at least an amorphous carbon film or an amorphous silicon film as a film that is in contact with the protective film.

18. A method comprising:
forming a first mask film over a substrate;
forming a protective film over the first mask film;
selectively forming a second mask film over the protective film to define a first portion of the protective film that is covered by the second mask film and a second portion of the protective film that is uncovered by the second mask film;
covering the second mask film and the second portion of the protective film with an anti-reflective film;
patterning the anti-reflective film to expose a part of the second mask film surface while keeping the second portion of the protective film covered by the anti-reflective film, the anti-reflective film being thereby converted into a patterned anti-reflective film;
patterning the second mask film by use of the pattern anti-reflective film as a mask, the second mask film being thereby converted into a patterned second mask film;
selectively removing the protective film and the first mask film by use of the patterned second mask film; and
removing the patterned second mask film and the protective film residing on the first mask film.

19. The method as claimed in claim 18, wherein the selectively forming the second mask film comprises:
forming over the protective film a layer serving as the second mask film;
forming an additional anti-reflective film over the layer; and
patterning the additional anti-reflective film and the layer to form the second mask film.

20. The method as claimed in claim 18, wherein the selectively forming the second mask film comprises:
forming over the protective film a layer serving as the second mask film;
forming a photoresist mask pattern over the layer without an intervention of an anti-reflective layer; and
selectively etching the layer by use of the photoresist mask pattern as a mask to form the second mask film.

* * * * *